US007273689B2

(12) United States Patent
Wieland et al.

(10) Patent No.: US 7,273,689 B2
(45) Date of Patent: Sep. 25, 2007

(54) METHOD TO REMOVE UNWANTED, UNEXPOSED, POSITIVE-WORKING, IR RADIATION SENSITIVE LAYER

(75) Inventors: Kevin Wieland, Greeley, CO (US); Kevin Barry Ray, Fort Collins, CO (US); Ken-ichi Shimazu, Briarcliff Manor, NY (US); Jianbing Huang, Trumbull, CT (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/058,973

(22) Filed: Feb. 16, 2005

(65) Prior Publication Data

US 2006/0183054 A1 Aug. 17, 2006

(51) Int. Cl.
*G03F 7/26* (2006.01)

(52) U.S. Cl. .................. 430/270.1; 430/302; 430/309; 430/463.1; 430/494

(58) Field of Classification Search ............ 430/270.1, 430/302, 309, 494; 101/463.1
See application file for complete search history.

(56) References Cited

U.S. PATENT DOCUMENTS 5,345,870 A * 9/1994 Bailey et al. ............ 101/463.1
6,248,503 B1 * 6/2001 Vermeersch et al. ........ 430/302
6,732,653 B2 * 5/2004 Shimazu et al. ......... 101/463.1
6,843,176 B2 * 1/2005 Ray et al. ................ 101/463.1

FOREIGN PATENT DOCUMENTS

JP 1-142638 A * 6/1989

* cited by examiner

*Primary Examiner*—Barbara L. Gilliam
(74) *Attorney, Agent, or Firm*—J. Lanny Tucker

(57) ABSTRACT

A method for eliminating unwanted ink-receptive sections in positive working printing plates resulting from shading of the surface layer during exposure by the clamps holding the plate on the exposure apparatus following development of an imagewise exposed precursor. Accordingly the areas that are shaded are identified prior to development and the surface layer is scored in those areas to a depth and density sufficient to result in the scored layer being removed during development but not deep enough to damage the underlying hydrophilic layer.

9 Claims, 1 Drawing Sheet

METHOD TO REMOVE UNWANTED, UNEXPOSED, POSITIVE-WORKING, IR RADIATION SENSITIVE LAYER

FIELD OF THE INVENTION

The invention relates to positive-working IR sensitive lithographic printing plates. More particularly, it relates to methods for avoiding the need to remove unwanted, unexposed areas left on the finished plates due to shading of sections of the plate precursors by platesetter clamps or other plate-holding elements.

BACKGROUND OF THE INVENTION

In lithographic printing, ink-receptive regions, known as image areas, are generated on a hydrophilic surface. When the surface is moistened with water and ink is applied, the hydrophilic regions retain the water and repel the ink, and the ink-receptive regions accept the ink and repel the water. The ink is then transferred to the surface of a material upon which the image is to be reproduced. Typically, in a method known as "offset", this is done indirectly by first transferring the ink to an intermediate blanket, which in turn transfers the ink to the surface of the material upon which the image is to be reproduced.

A class of imageable elements called printing plate precursors, useful for preparing lithographic printing plates, comprises a layer applied over the surface of a hydrophilic substrate. The layer includes one or more radiation-sensitive components, which may be dispersed in a suitable binder. Alternatively, or in addition, the binder itself may be radiation-sensitive. The layer is commonly applied as a coating, using a solvent. Many positively working, thermally sensitive plates also include a surface layer that exhibits resistance to developer action.

During exposure this surface layer is destroyed in the exposed areas. After exposure to radiation the exposed regions of the coating are removed in the developing process, revealing the underlying hydrophilic surface of the substrate. Such a plate precursor is referred to as "positive-working". The regions of the radiation-sensitive layer (i.e., the image areas) that remain are ink-receptive, and the regions of the hydrophilic surface revealed by the developing process accept water, typically a fountain solution, and repel ink. Recent developments in the field of printing plate precursors deal with radiation-sensitive compositions that can be imagewise exposed by means of lasers or laser diodes. This type of exposure, known as digital imaging, does not require films as intermediate information carriers since lasers can be controlled by computers.

Thermally imageable elements useful as lithographic printing plate precursors, exposable by infrared lasers or laser diodes as described above, are becoming increasingly important in the printing industry. Generally speaking, after imagewise thermal exposure, the rate of removal of the exposed regions by a developer in positive-working elements is greater than the rate of removal of the unexposed regions, so that during development the exposed regions are removed by the developer to form an image.

Imaging of digital, thermally imageable precursors is typically done using platesetters, where the plate precursor is mounted either i). on a rotatable drum (external drum), typically using clamps, or ii). in a drum (internal device), in which case the plate precursors are held in place with compressed air or with clamps, which may be magnetic.

When a positive-working lithographic printing plate precursor is imaged on a platesetter employing clamping devices for holding the precursor onto the outside surface of an exposure unit, the clamping device prevents the successful exposure of the coating immediately under it. After development, this unexposed area of coating accepts ink. Unless this section of coating is removed manually (a time-consuming process), it will cause an unwanted image on the press. The problem is particularly troublesome for web presses, where ink is wasted and unwanted inked image areas can transfer to the back of paper stocks.

Rather than using clamps, some platesetters employ suction cups and powerful vacuums. On mounting a plate precursor on such a platesetter, however, at least one edge of the plate precursor is typically inserted into a crevice in the drum, where it is shaded from the imaging radiation. In such systems, the presence of unwanted, remaining image areas is therefore still not avoided. Thus there remains a need for ways of avoiding the time-consuming step of removing such unwanted image areas after plate development.

SUMMARY OF THE INVENTION

This need is addressed by the present invention. In one aspect, the invention is a method for eliminating at least one unwanted ink-receptive section in a printing plate following development of an imagewise exposed precursor, wherein said precursor comprises a developer resistant surface layer that remains effective in resisting development in areas of the precursor that are not exposed during exposure of the precursor, the method comprising:

identifying the areas shaded by the clamps holding the precursor and therefore remaining undesirably unexposed; and prior to developing the precursor to form a printing plate, scoring the developer resistant layer in at least one of the identified undesirably unexposed areas to a depth and density sufficient to render the otherwise developer resistant layer ineffective to resist development of the undesirably unexposed areas.

Also according to the present invention there is provided a positive working printing plate precursor comprising a developer resistant surface layer that is rendered soluble in a developer following exposure to radiation wherein the surface layer is scored to a depth and density sufficient to render the surface layer ineffective in resisting development when immersed in the developer. The scoring is in predetermined surface areas corresponding to areas on the precursor surface that remain unexposed to radiation due to undesirable shading during exposure. Typically the shaded areas are areas under clamps that hold the precursor on the exposure device.

DETAILED DESCRIPTION OF THE INVENTION

The invention will next be described with reference to the figures where same numerals identify same elements in all figures. The figures are not to scale and are illustrative of the invention rather than engineering drawings. Because they are intended to explain rather than to serve as a construction blueprint they include only as many elements as are necessary for the person skilled in the art to understand and practice the invention. Thus they are not to scale nor do they include all elements that such person would add to provide an actual engineering drawing for constructing or practicing the invention.

One process of producing a printing plate from a positive-working printing plate precursor involves providing a precursor comprising a support and a radiation sensitive layer coated thereon, imagewise exposing it to radiation designed to make exposed parts of the radiation-sensitive layer soluble or dispersible in a developer, and using the developer to remove the soluble parts and produce a finished plate. Exposure typically occurs in an exposure unit wherein the precursor is held securely in place. As a result there are areas of the precursor that do not receive any radiation exposure because they are shaded by the clamps that are holding the precursor in proper position during the radiation exposure step. We will refer to such areas as "undesirably unexposed areas" to distinguish them from the areas on the plate that are intentionally shaded or otherwise left unexposed during imagewise exposure in order to form an image.

Figure 1:
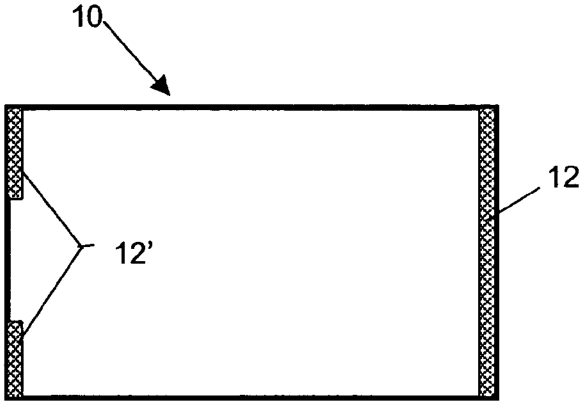
FIG. 1 is a schematic illustration of a top view of a printing plate precursor prepared in accordance with the present invention.

FIG. 1 shows a plate 10 containing such undesirably unexposed areas 12 and 12'. These are the areas where the clamps holding the plate during exposure prevented the exposing radiation from reaching the plate surface. As a result the areas 12 and 12', which are typically but not necessarily along the plate leading and trailing edges remain unexposed and therefore insoluble to the developer. Insoluble areas are ink receptive and will pick up ink and print as unwanted black strips when the plate is ultimately mounted on the press.

Areas 12 and 12', are, however, predictable. Modern printing business has steadily switched to using computer control exposure units known as platesetters. There only a limited number of platesetter manufacturers and the clamping arrangement used in each of the platesetters is known. Thus, the location and size of areas 12 and 12' for any given size plate and platesetter combination can be calculated in advance. Therefore all that is needed to eliminate the problem of undesirable unexposed areas in the printing plate is to identify the location and size of such areas for a precursor/platesetter combination and render such identified areas soluble prior to developing the plate.

As discussed earlier, positive working plates include a radiation sensitive layer which following exposure to radiation becomes soluble in the developer and is removed during the development step to uncover a hydrophilic underlying surface. According the present invention a similar result is obtained by scuffing, scratching, or abrading the radiation sensitive surface layer so that developer penetrates the scored layer and removes it even though such layer has not been rendered more soluble by exposure to radiation. We will refer to this scuffing/scratching/abrading process as "scoring" of the undesirable unexposed area.

Figure 2:
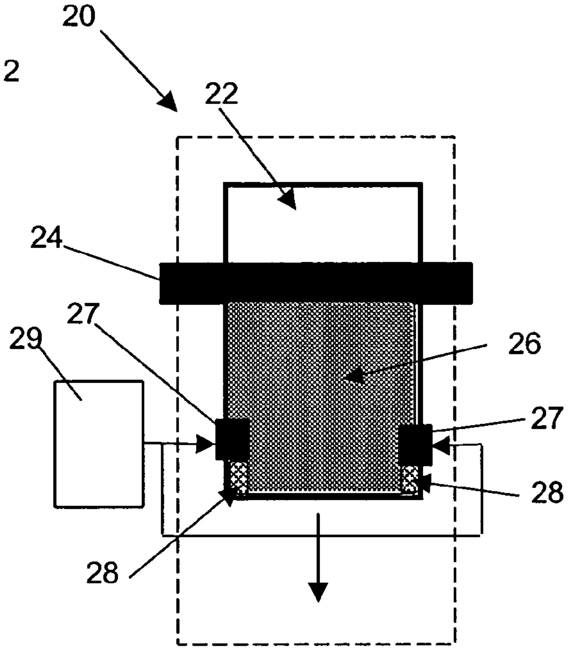
FIG. 2 is a schematic representation of apparatus for the abrasion of selected plate precursor surface areas in accordance with this invention.

FIG. 2 shows one embodiment of this invention wherein the scoring of the precursor occurs prior to the precursor mounting and exposure in a platesetter. Such scoring could, for example occur during the manufacturing of the precursor following the coating of the top surface layer. For example, in the production line 20 a plate 22 is coated with a radiation sensitive top layer at a coating station 24 using anyone of the well known coating methods used in this art. The coated surface 26 is subsequently scored using scoring wheels 27 to produce scored areas 28. The scoring wheels are preferably retractable and controlled by a computer 29 programmed to score the plates according to predetermined patterns based on the exposure device on which the precursor will be used. Pre-scoring the precursor is particularly advantageous where the anticipated use of the precursor is in automated equipment.

Figure 3:
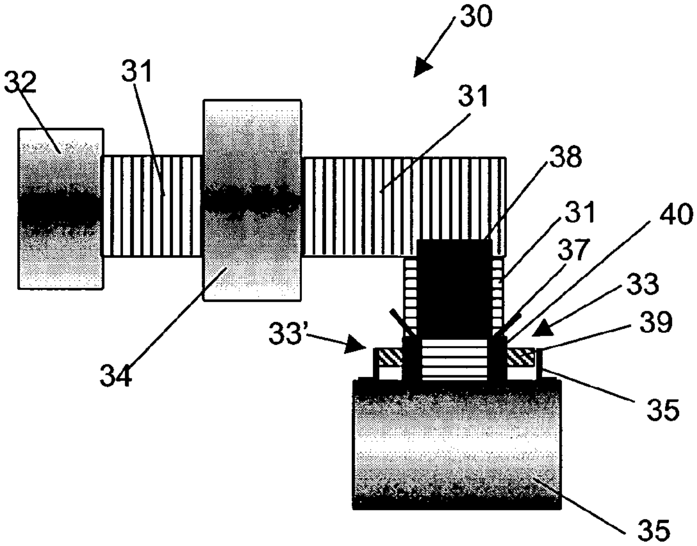
FIG. 3 is a schematic representation of a modification to a plate processor in order to implement the present invention.

Alternatively, as shown in FIG. 3 the precursor may be scored following exposure in an automated exposure/development arrangement 30. As illustrated an automatic plate loader 32 places a plate on transport 31 and loads it in exposure unit 34 which may be a platesetter. Following exposure the plate 38 is guided to the entrance of developer 35. Mounted at the developer entrance is one and preferably two scoring stations 33 and 33'. The scoring stations may be demountable and mounted on the developer using brackets 35. They may include a spindle 39 and an abrading wheel 40. Guide plate 37 may be used to assure that the plate is properly positioned for the scoring to take place at predetermined locations along the plate edge. The scoring attachment may be simple as shown, or more sophisticated comprising a motor to drive the scoring wheel and lifting levers to engage and disengage at will the wheel from the plate surface. Of course, more than two may be used if needed. Such mechanical arrangements are well known in the art and not the subject of this invention.

The degree of scoring should be controlled so that the underlying hydrophilic layer is undamaged. The scoring most typically results in complete coating removal during development. However one may control the degree of scoring such as to leave a fine tint pattern at the gripper (clamp) edge, for example something equivalent to a 2% dot pattern. Such pattern is essentially unnoticeable to the human eye. However this pattern serves to scavenge unwanted ink away from the paper stock and prevents build up in the non imaged areas.

Because plates vary in construction the degree of pressure and scoring will usually need to be established experimentally for each plate type. Typically, using a scouring pad such as 3M's no. 9488 Scotch-Brite Soft Scour pad as supplied by Grainger, Fort Collins, Colo. for a plate transported past the scouring station at a rate of about 0.5 meters/minute to about 1.5 meters/minute a scouring wheel spinning at less than about 200 rpms and preferably about 150 rpms or less or even as low as 100 rpms has proven adequate when the applied pressure is about 2 to about 4 oz per square inch. However these numbers are highly dependent on the nature of the surface coating that is being scoured and the scouring pad used. These numbers should, therefore, only be considered as a starting point for determining experimentally the required rpms and pressure in each case as stated above.

Printing Plate Precursors

A variety of printing plate precursors is available commercially. Depending on the type of precursor, the imaging radiation is commonly visible radiation, ultraviolet radiation, or infrared radiation, with precursors of this last type also being called "thermal" plate precursors.

Thermal plate precursors are characterized by the presence of a "photothermal conversion material" which absorbs the imaging radiation and converts it to heat, causing imaged areas of the precursor to become soluble or dispersible in the developer. Photothermal conversion materials may absorb ultraviolet, visible, and/or infrared radiation to perform this function. Such materials are disclosed in numerous patents and patent applications, including Nagasaka, EP 0,823,327; Van Damme, EP 0,908,397; DeBoer, U.S. Pat. No. 4,973,572; Jandrue, U.S. Pat. No. 5,244,771; and Chapman, U.S. Pat. No. 5,401,618. Examples of useful absorbing dyes include ADS-830 WS and ADS-1064 (both available from American Dye Source, Montreal, Canada), EC2117 (available from FEW, Wolfen, Germany), CYASORB® IR 99 and CYASORB® IR 165 (both available from Glendale Protective Technology), EPOLITE® IV-62B and EPOLITE® III-178 (both available from the Epoline), PINA-780 (available from the Allied Signal Corporation), SpectralR 830A and SpectralR 840A (both available from Spectra Colors).

Plate precursors useful for this invention include 1-layer thermal plate precursors, which are a preferred embodiment. These are commercially available under such trade names as ELECTRA® and ELECTRA® EXCEL, available from Kodak Polychrome Graphics. Single layer thermal plate precursors are described by Parsons, U.S. Pat. No. 6,280,899, incorporated herein by reference.

Also preferred are 2-layer products in which the photothermal conversion material resides in the bottom layer. Such products are commercially available under the trade names SWORD™, SWORD EXCEL™ and SWORD ULTRA™ from Kodak Polychrome Graphics. Systems of this sort are described by Shimazu in U.S. Pat. No. 6,352,812 and by Savariar-Hauck in U.S. Pat. No. 6,358,669, both incorporated herein by reference, and comprise a hydrophilic substrate, an underlayer on the substrate which comprises a developer-soluble or developer-dispersible polymer and a photothermal conversion material, and a top layer that is not soluble or dispersible in the developer.

Also useful for this invention are 2-layer thermal plate precursors in which the photothermal conversion material resides in the top layer. These are described for instance by Van Damme, EP-0-864-420-A1 and Verschueren, EP-0-940-266-A1.

Three-layer thermal plate precursors are also useful, such as are described in U.S. application Ser. No. 09/999,587, incorporated herein by reference. Such systems comprise a hydrophilic substrate, an underlayer on the substrate which comprises a developer-soluble or developer-dispersible polymer and a photothermal conversion material, a barrier layer to prevent the photothermal conversion material from migrating, comprising a developer-soluble or developer-dispersible polymer, and a top layer comprising a polymer that is not soluble or dispersible in the developer.

Also useful for this invention are 2-layer visible light sensitive plate precursors, of which a number of models are well known and commercially available.

Another type of printing plate precursor suitable for use with this invention is described by Watkiss in U.S. Pat. No. 4,859,290. In such a system, unexposed silver halide diffuses to the surface of an aluminum substrate bearing nuclei capable of reducing the silver halide to metallic silver, which forms the basis for an oleophilic region on the developed plate.

Although the above-mentioned systems are the most common, the invention is applicable to radiation-sensitive positive-working systems irrespective of the number of layers employed in the plate precursor, and irrespective of whether the hydrophilic areas of the finished plate are formed by removal of hydrophobic material or by preventing the conversion of hydrophilic areas to ink-receptive ones. In general, these precursors are all employed in their routine manner of use, except where explicitly deviated from for the purposes of the invention.

Imagewise Exposure

Imaging of the precursors can be performed with commercially available exposure devices, also known as platesetters. For thermal systems, for example, one can use a Creo TRENDSETTER® 3244, supplied by CreoScitex Corporation, Burnaby, Canada; a Platerite 8000, supplied by Screen, Rolling Meadows, Ill.; or a Gerber Crescent 42T, supplied by the Gerber Corporation. Many others are available, and any of these is applicable. The platesetter is used according to normal procedures for the unit, except where explicitly deviated from for the purposes of the invention. Typical exposure conditions for thermal plate precursors are given in the Examples.

For platesetters using visible light, commercial units include Platerite from Screen, Rolling Meadows, Ill.; LaserStar from Krause, Branford, Conn.; Antares 1600 from Cymbolic Sciences, Blaine, Wash.; Galileo from Agfa, Wilmington, Mass.; and Lithosetter III from Barco Graphics, Vandalia, Ohio.

Developing the Plate Precursors

Developing of the exposed precursors to form the finished plates is performed with commercially available developers designed for the type of plate precursor being used. Many types are available, and their selection and use is well known in the art. Essentially any developer normally suitable for use with a particular plate precursor is suitable for use in the practice of this invention. In general, normal procedures are used unless specific mention is made to the contrary.

EXAMPLES

The following printing plates (all positive working, thermally sensitive), size 120×450×0.3 mm were rubbed with a scourer (3M no. 9488 Scotch-Brite Soft Scour pad as supplied by Grainger, Fort Collins, Colo.) for 30 strokes, such that the coating on each 450 mm long edge was scored to a width of 10 mm.

The plates were then developed in either:

A]. 956 developer (phenoxyethanol containing developer as supplied by Kodak Polychrome Graphics), Quartz 85NS processor at 3 ft/min (as supplied by Glunz and Jensen, Elkwood, Va., USA) or B]. Goldstar developer (a metasilicate developer), Mercury Mark V processor, 750 mm/min and developer temperature=23° C. (both Kodak Polychrome Graphics).

Finally the plates were examined for remaining unwanted, undeveloped coating at the scratched regions.

Example 1

Plate: Sword Excel from Kodak Polychrome Graphics, Norwalk, Conn., US.

Developing Condition: A

Result: Plate free of coating in scratched areas.

Example 2

Plate: Electra Excel from Kodak Polychrome Graphics, Norwalk, Conn., US

Developing Condition: B

Result: Plate almost free of coating in scratched areas. At processing speed of 500 mm/min, plate is clean Example 3

Plate: Brillia LH PI from Fuji Photo Film, Kanagawa-ken, Japan

Developing condition: B

Result: Plate almost free of coating in scratched areas. At processing speed of 500 mm/min, plate is clean.

Example 4

Plate: Thermostar P970 from Agfa-Gevaert, Mortsel, Belgium.

Developing condition: B

Result: Plate almost free of coating in scratched areas. At processing speed of 500 mm/min, plate is clean.

Example 5

Plate: Rubi T-50 from Ipagsa, Rubi, Barcelona, Spain.

Developing condition B

Result: Plate free of coating in scratched areas.

Example 6

Plate: Extrema 830.2G from Lastra SPA, Manerbio, Italy

Developing condition: B

Result: Plate free of coating in scratched areas

Example 7 (Comparative)

A Sword Excel printing plate, size 460×660×0.3 mm, was exposed on a Creo Trendsetter 3244 under the following conditions: 13.5 W, drum speed 250 rpm, with an imaging energy density of 120 $MJcm^2$, using an solid internal image pattern (100% exposure, plot 12). The plate was then immersed in 956 developer using a Quartz 85 NS processor at 3 ft/min. Examination of the processed plate, indicated unexposed coating areas around the lead and trailing edges of the plate, where the clamping device of the image setter covered the plate surface, thus blocking exposure to the thermal laser.

On a press, such unwanted coating would produce a printed image. In order to eliminate such undesired coating, the plate requires manual treatment with a deletion method, adding additional manual steps, in an otherwise completely automated process. (Note: “Leading Edge” means this edge was the first edge to be transported into the image setter. The “trailing edge” was last in.)

Example 8

A Sword Excel printing plate as described and exposed in example 7, was rubbed with a scourer (3M no. 9488 Scotch-Brite Soft Scour pad as supplied by Grainger, Fort Collins, Colo.) for 30 strokes, such that the coating on each 660 mm long edge was scored to a width of 10 mm, (the leading and trailing edges). The plate was then immersed in 956 developer, using a Quartz 85 NS processor at 3 ft/min. On examination of the processed plate, no unwanted, retained coating could be seen on the leading and trailing edges.

Example 9

The Sword Excel printing plate as described in comparative example 7, was rubbed with a scourer (3M no. 9488 Scotch-Brite Soft Scour pad as supplied by Grainger, Fort Collins, Colo.) for 30 strokes, such that the coating on each 660 mm long edge was scratched to a width of 10 mm, (the leading and trailing edges). Next, the plate was exposed on a Creo Trendsetter 3244 under the following conditions: 13.5 W, drum speed 250 rpm, with an imaging energy density of 120 $mJcm^2$, using an solid internal image pattern (100% exposure, plot 12). The plate was then immersed in 956 developer, using a Quartz 85 NS processor at 3 ft/min. On examination of the processed plate, no unwanted, retained coating could be seen on the leading and trailing edges.

Example 10

A Sword Excel printing plate, size 120×450×0.3 mm, was rubbed with a scourer (3M no. 9488 Scotch-Brite Soft Scour pad as supplied by Grainger, Fort Collins, Colo.) using a power hand drill. The scouring pad was mounted to the hand drill using Velcro® tape, one side of which was attached to the pad the other to a circular neoprene pad about three inches in diameter and one half inch thick. The pad was affixed onto a circular steel platform which was mounted to the drill chuck. This arrangement permitted easy replacement of scouring pads. The drill rotates at 100 revolutions per minute. The coating on each 450 mm long edge was scratched to a width of 10 mm, (the trailing and leading edges). The plate was then developed in 956 developer, using a Quartz 85NS processor at 3 ft/min. On examination of the processed plate, no unwanted, retained coating could be seen on the leading and trailing edges.

Example 11

A Sword Excel printing plate, size 120×450×0.3 mm, was rubbed with a steel wool pad (grade 0000, superfine as supplied by Briwax Wood Care Products, www.briwax-woodcare.com) using the drill attachment described in example 10 above. The drill rotates at 100 revolutions per minute. The coating on each 450 mm long edge was scratched to a width of 10 mm, (the trailing and leading edges). The plate was then developed in 956 developer, using a Quartz 85NS processor at 3 ft/min. On examination of the processed plate, no unwanted, retained coating could be seen on the leading and trailing edges. In addition, the revealed hydrophilic substrate was not damaged by the steel wool.

Example 12

Example 11 was repeated, except that the steel wool pad used was of grade 000, extra fine, as supplied by Briwax Wood Care Products. No unwanted, retained coating could be seen on the leading and trailing edges. In addition, the revealed hydrophilic substrate was not damaged by the steel wool.

Example 13

Example 11 was repeated, except that the steel wool pad used was of grade 00, very fine, as supplied by Briwax Wood Care Products. Again no unwanted, retained coating could be seen on the leading and trailing edges. In addition, the revealed hydrophilic substrate was not damaged by the steel wool.

Example 14

Prophetic

After thermal image-wise exposure (laser power 13.5 W, drum speed 250 rpm, imaging energy density of 120 $MJcm^2$, using a Creo Trendsetter 3244), but prior to development, a Sword Excel printing plate is scuffed in regions of the plate where undesired coating would otherwise remain—"the leading and trailing plate edges". In this situation the "abrader" is attached to an 85NS processor front entrance.

Having described the invention, we now claim the following and their equivalents.

What is claimed is:

1. A method for eliminating at least one unwanted ink-receptive section in a printing plate following development of an imagewise exposed positive-working printing plate precursor, wherein said positive-working printing plate precursor comprises a developer resistant surface layer that remains effective in resisting development in areas of the positive-working printing plate precursor that are undesirably not exposed during exposure of the positive-working printing plate precursor, the method comprising:

(a) identifying at least one of said undesirably unexposed areas of said positive-working printing plate precursor; and (b) prior to developing said positive-working printing plate precursor to form said printing plate, scoring said developer resistant layer in said at least one identified undesirably unexposed area to a depth and density sufficient to render said developer resistant layer ineffective to resist development of said at least one identified undesirably unexposed area.

2. The method according to claim 1 wherein said steps of identifying and scoring said at least one undesirably unexposed area of said imagewise exposed positive-working printing plate precursor occur prior to its imagewise exposure.

3. The method according to claim 1 wherein said developer resistant surface layer is thermally sensitive.

4. The method according to claim 1 wherein said step of identifying said undesirably unexposed areas comprises identifying a location on said positive-working printing plate precursor corresponding to a location where a clamp of a preselected exposure device contacts said positive-working printing plate precursor when said positive-working printing plate precursor is mounted on said exposure device.

5. The method according to claim 4 wherein said scoring of said positive-working printing plate precursor surface is controlled by a computer.

6. The method according to claim 5 wherein said computer includes a data base and said data base includes data identifying a plurality of locations where clamps of a plurality preselected exposure devices contact said positive-working printing plate precursor when said positive-working printing plate precursor is mounted on a selected one of said plurality of exposure devices.

7. A positive-working printing plate precursor comprising a surface layer that is developer resistant prior to exposure to imaging radiation wherein said surface layer is scored in selected areas of said positive-working printing plate precursor to a depth and density sufficient to render said surface layer ineffective to resist development.

8. A positive working printing plate precursor comprising a developer resistant surface layer that is rendered soluble in a developer following exposure to radiation wherein said surface layer has been scored in predetermined surface areas to a depth and density sufficient to render said surface layer ineffective in resisting development when immersed in said developer in said predetermined surface areas corresponding to areas on said positive-working printing plate precursor surface that remain unexposed to radiation due to undesirable shading of said areas during exposure to said radiation.

9. The positive-working printing plate precursor according to claim 8 wherein said predetermined surface areas are areas shaded during exposure by elements of an exposure device holding said positive-working printing plate precursor thereon.

* * * * *